(12) United States Patent
Arnhold

(10) Patent No.: US 12,317,439 B2
(45) Date of Patent: May 27, 2025

(54) MODULAR SYSTEM FOR PRODUCING A HOUSING

(71) Applicant: R. STAHL SCHALTGERÄTE GMBH, Waldenburg (DE)

(72) Inventor: Thorsten Arnhold, Pfedelbach (DE)

(73) Assignee: R. STAHL SCHALTGERATE GMBH, Waldenburg (DE)

( * ) Notice: Subject to any disclaimer, the term of this patent is extended or adjusted under 35 U.S.C. 154(b) by 393 days.

(21) Appl. No.: 17/611,884

(22) PCT Filed: May 5, 2020

(86) PCT No.: PCT/EP2020/062466
§ 371 (c)(1),
(2) Date: Nov. 16, 2021

(87) PCT Pub. No.: WO2020/233983
PCT Pub. Date: Nov. 26, 2020

(65) Prior Publication Data
US 2022/0210926 A1    Jun. 30, 2022

(30) Foreign Application Priority Data
May 17, 2019   (DE) .......................... 102019113193.6

(51) Int. Cl.
*H05K 5/02* (2006.01)
*H02B 1/28* (2006.01)
*H05K 5/10* (2025.01)

(52) U.S. Cl.
CPC ................. *H05K 5/10* (2025.01); *H02B 1/28* (2013.01)

(58) Field of Classification Search
CPC .......... H02G 3/08; H02G 3/081; H02G 3/086; H02G 3/088; H02B 1/28; H02B 1/30; H02B 1/40; H05K 5/0004; H05K 5/00; H05K 5/02; H05K 5/04; H05K 7/00
USPC .... 174/50, 520, 559, 560, 561; 220/3.2–3.9, 220/4.02; 361/600, 601
See application file for complete search history.

(56) References Cited

U.S. PATENT DOCUMENTS

| | | | | |
|---|---|---|---|---|
| 1,205,589 | A | * | 11/1916 | Young .................... H02G 3/086 220/3.92 |
| 1,249,313 | A | * | 12/1917 | Boyton .................. H02G 3/086 220/DIG. 25 |
| 3,564,112 | A | * | 2/1971 | Algotsson ................ H02B 1/40 361/641 |

(Continued)

FOREIGN PATENT DOCUMENTS

| | | |
|---|---|---|
| CA | 2139840 A1 | 7/1996 |
| CN | 201064000 Y | 5/2008 |

(Continued)

OTHER PUBLICATIONS

Office Action dated Aug. 30, 2023; CN Application No. 202080036694.8; 12 pages (non-English).

(Continued)

*Primary Examiner* — Angel R Estrada
(74) *Attorney, Agent, or Firm* — CANTOR COLBURN LLP

(57) ABSTRACT

An explosion-proof housing, preferably of the 'flameproof enclosure' protection type, wherein the housing comprises a plurality of, preferably cast, wall modules.

17 Claims, 11 Drawing Sheets

(56) References Cited

U.S. PATENT DOCUMENTS

| | | | | |
|---|---|---|---|---|
| 3,691,432 | A | * | 9/1972 | Edfors ............... H05K 7/20572 |
| | | | | 361/679.48 |
| 4,620,061 | A | * | 10/1986 | Appleton ................. H02G 3/14 |
| | | | | 220/3.8 |
| 4,664,281 | A | * | 5/1987 | Falk ......................... H02B 1/28 |
| | | | | 174/547 |
| 5,534,664 | A | * | 7/1996 | Fearing, Jr. .............. H02G 3/20 |
| | | | | 220/88.1 |
| 5,798,910 | A | * | 8/1998 | Holbeche ............... H05K 5/063 |
| | | | | 174/559 |
| 5,880,401 | A | | 3/1999 | Leischner et al. |
| 6,527,302 | B1 | * | 3/2003 | Gault ..................... F16L 41/03 |
| | | | | 174/50 |
| 6,903,272 | B2 | * | 6/2005 | Dinh ...................... H02G 3/086 |
| | | | | 174/54 |
| 7,005,576 | B2 | * | 2/2006 | Niederriter ............ H02G 3/088 |
| | | | | 174/67 |
| 8,124,872 | B2 | * | 2/2012 | Vigorito ................... H05K 5/02 |
| | | | | 174/53 |
| 8,553,405 | B2 | | 10/2013 | Sun |
| 8,987,592 | B2 | | 3/2015 | Mack et al. |
| 10,537,760 | B2 | | 1/2020 | Barz |
| 11,004,580 | B2 | | 5/2021 | Kutsch et al. |
| 11,231,237 | B2 | | 1/2022 | Chopard et al. |
| 11,291,128 | B2 | * | 3/2022 | Arnhold ............... H02B 13/025 |
| 11,578,862 | B2 | | 2/2023 | Naumann et al. |
| 11,690,181 | B2 | * | 6/2023 | Kondrus .............. H05K 5/0013 |
| | | | | 174/520 |
| 2010/0140274 | A1 | | 6/2010 | Lasarzik et al. |
| 2010/0265744 | A1 | | 10/2010 | Dorn et al. |
| 2016/0085022 | A1 | | 3/2016 | Yang et al. |
| 2020/0113075 | A1 | | 4/2020 | Arnhold et al. |
| 2021/0143617 | A1 | | 5/2021 | Arnhold et al. |

FOREIGN PATENT DOCUMENTS

| | | | |
|---|---|---|---|
| CN | 201411099 | Y | 2/2010 |
| CN | 201587649 | U | 9/2010 |
| CN | 201718130 | U | 1/2011 |
| CN | 202423038 | U | 9/2012 |
| CN | 102915091 | A | 2/2013 |
| CN | 103338610 | A | 10/2013 |
| CN | 203934167 | U | 11/2014 |
| CN | 204168616 | U | 2/2015 |
| CN | 104470298 | A | 3/2015 |
| CN | 205082092 | U | 3/2016 |
| CN | 105848439 | A | 8/2016 |
| CN | 107230763 | A | 10/2017 |
| CN | 108139177 | A | 6/2018 |
| CN | 108954083 | A | 12/2018 |
| CN | 109688770 | A | 4/2019 |
| CN | 110831671 | A | 2/2020 |
| CN | 108028109 | B | 12/2021 |
| DE | 202004019510 | U1 | 2/2005 |
| DE | 102007048418 | A1 | 4/2009 |
| DE | 102009053846 | A1 | 8/2010 |
| DE | 102011001723 | A1 | 10/2012 |
| DE | 102014116149 | A1 | 5/2016 |
| DE | 102017105683 | A1 | 9/2018 |
| DE | 202018103259 | U1 | 10/2018 |
| DE | 102017112147 | A1 | 12/2018 |
| DE | 102017112149 | A1 | 12/2018 |
| DE | 102017119982 | A1 | 2/2019 |
| DE | 102017122957 | A1 | 4/2019 |
| EP | 1418658 | A2 | 5/2004 |
| EP | 1701109 | A2 | 3/2006 |
| JP | 2008182093 | A | 8/2008 |

OTHER PUBLICATIONS

Chinese Office Action dated Jan. 20, 2023; Chinese Application No. 202080036694.8; 10 pages (non-English).

German Office Action for Application No. 102019113193.6; Date of Mailing: Mar. 2, 2020; 8 Pages.

International Search Report for International Application No. PCT/EP2020/062466; Date of Completion: Jul. 22, 2020; Date of Mailing: Jul. 30, 2020; 14 Pages.

International Standard, IEC 60079-1; Preview: Electrical apparatus for explosive gas atmospheres—Part 1: Flameproof enclosures "d", Fourth edition, Feb. 2001, 11 pages.

Translation of International Search Report for International Application No. PCT/EP2020/062466; Date of Completion: Jul. 22, 2020; Date of Mailing: Jul. 30, 2020; 3 Pages.

Written Opinion for International Application No. PCT/EP2020/062466; Date of Mailing: Jul. 30, 2020; 9 Pages.

EPO Minutes of Telephone Call for corresponding DE Application No. 20 724 792.5; Mailing Date, Jan. 11, 2024.

CNIPA Decision on Rejection corresponding to CN Application No. 202080036694.8; Mailing Date, Jan. 15, 2024.

* cited by examiner

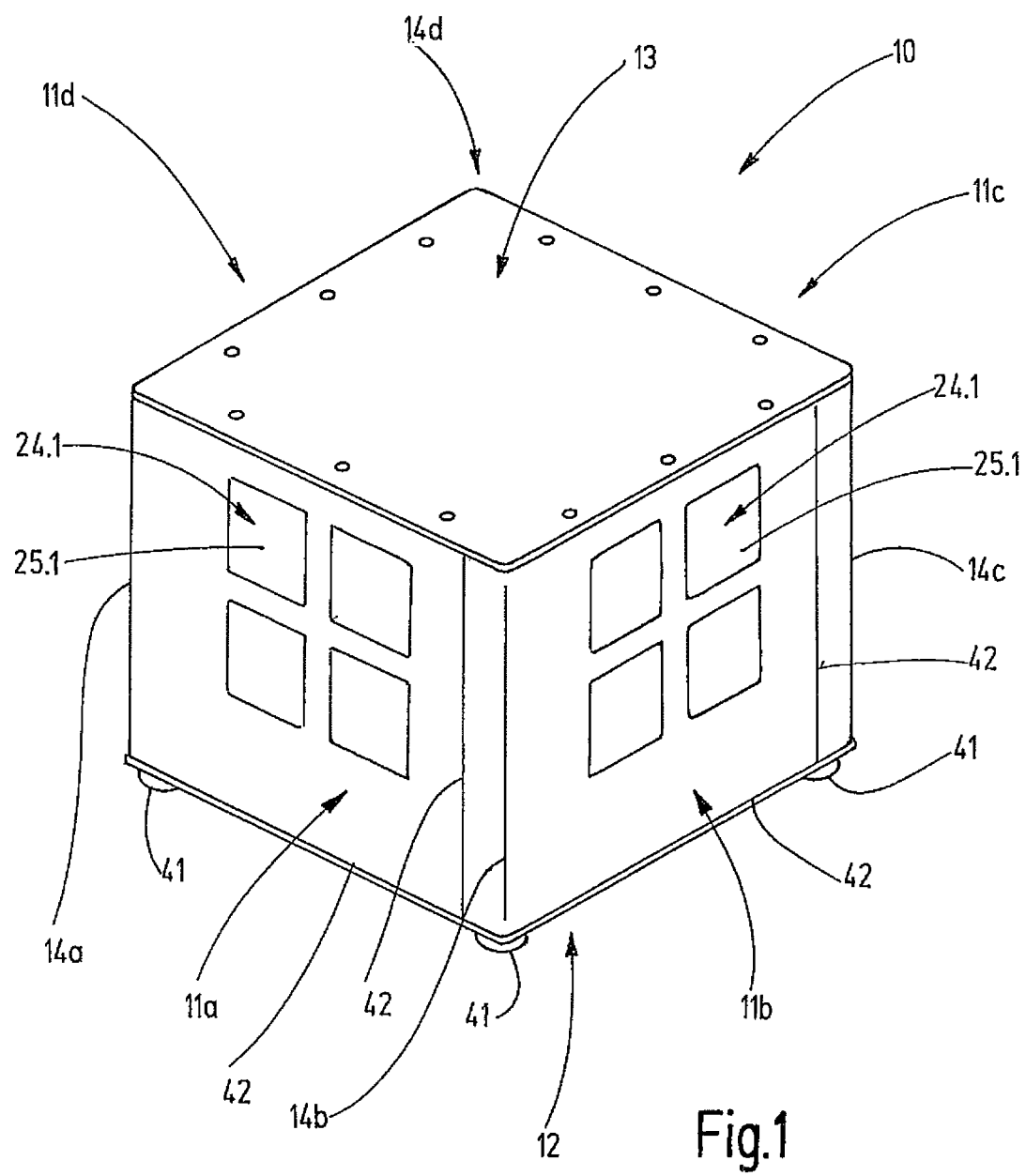

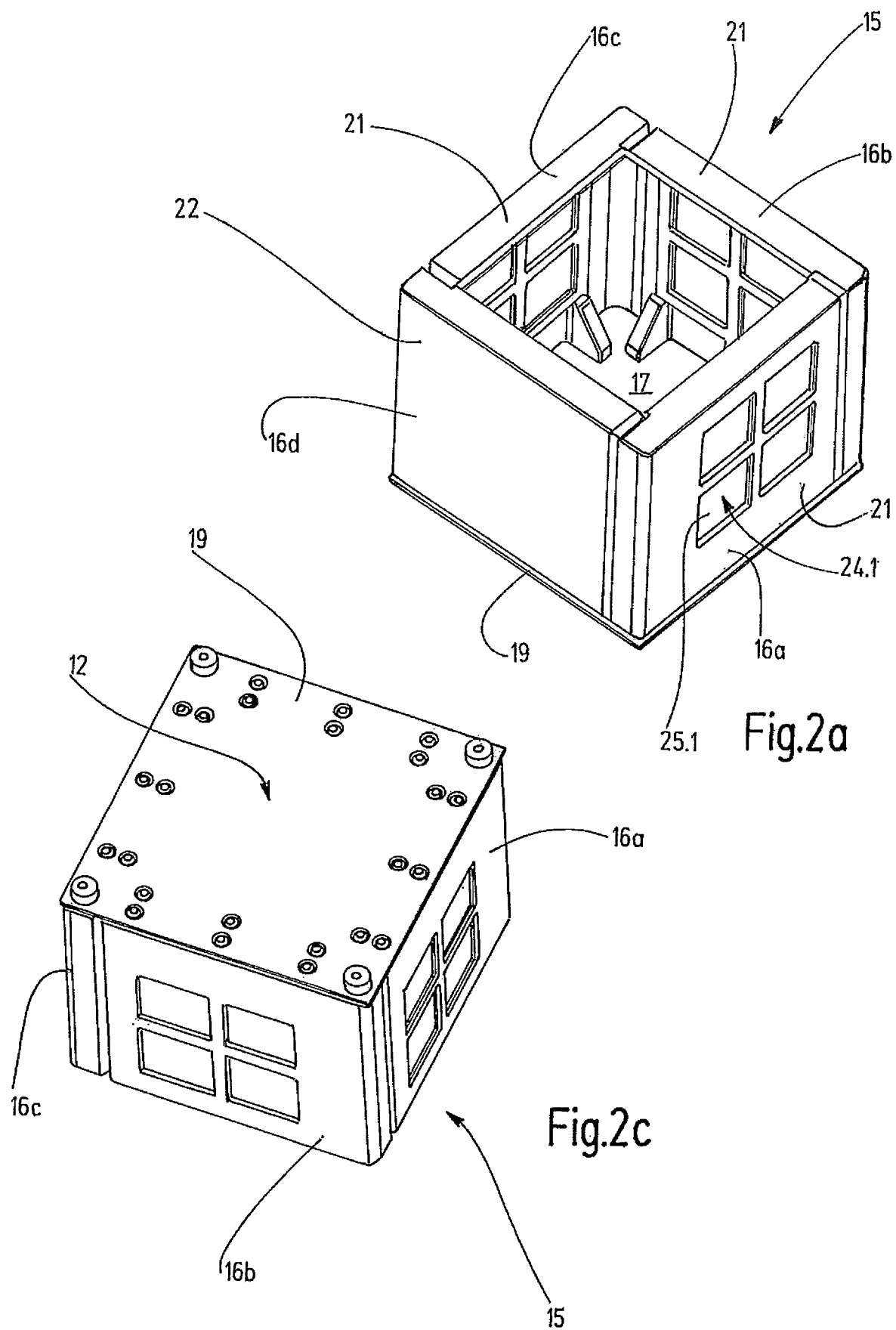

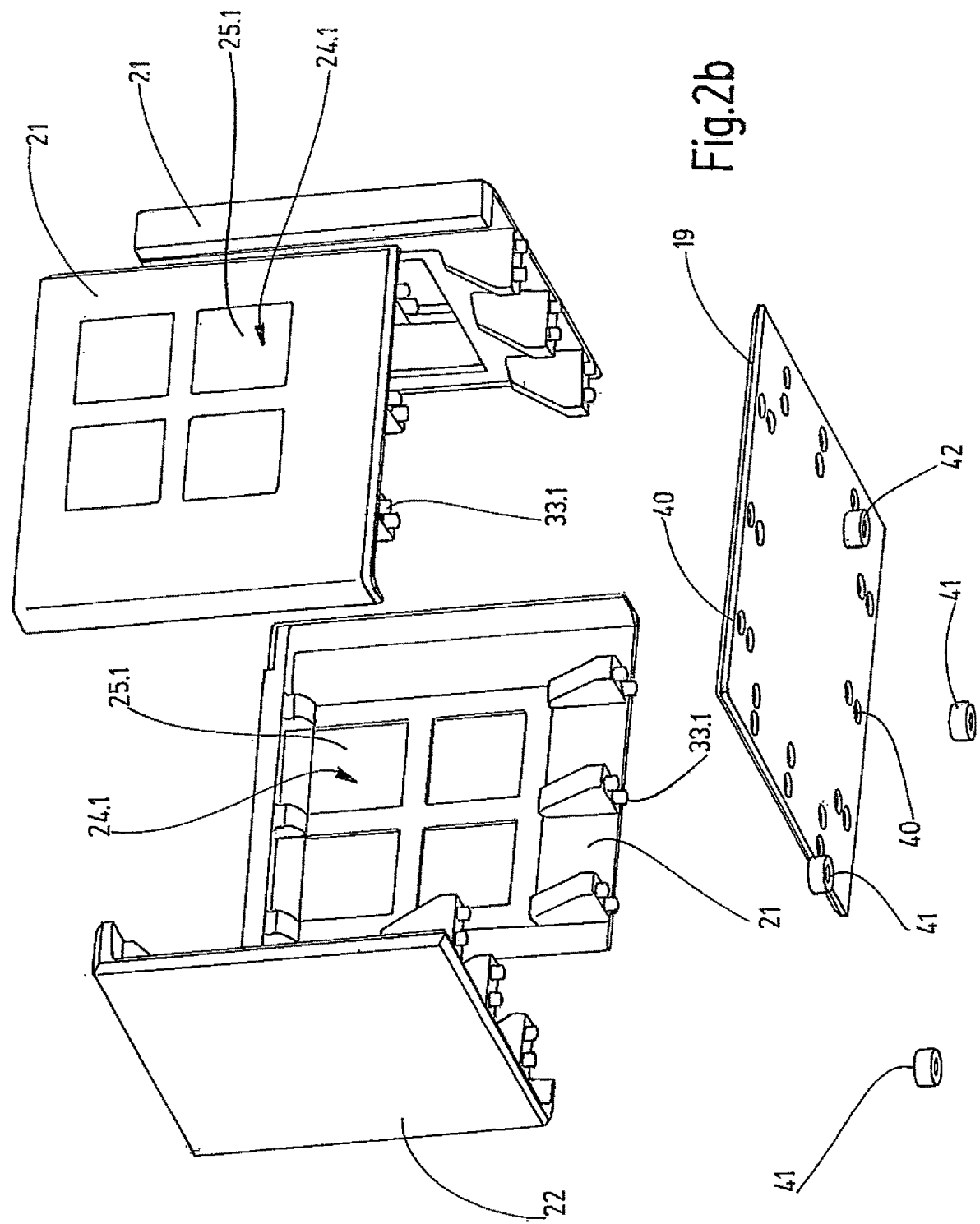

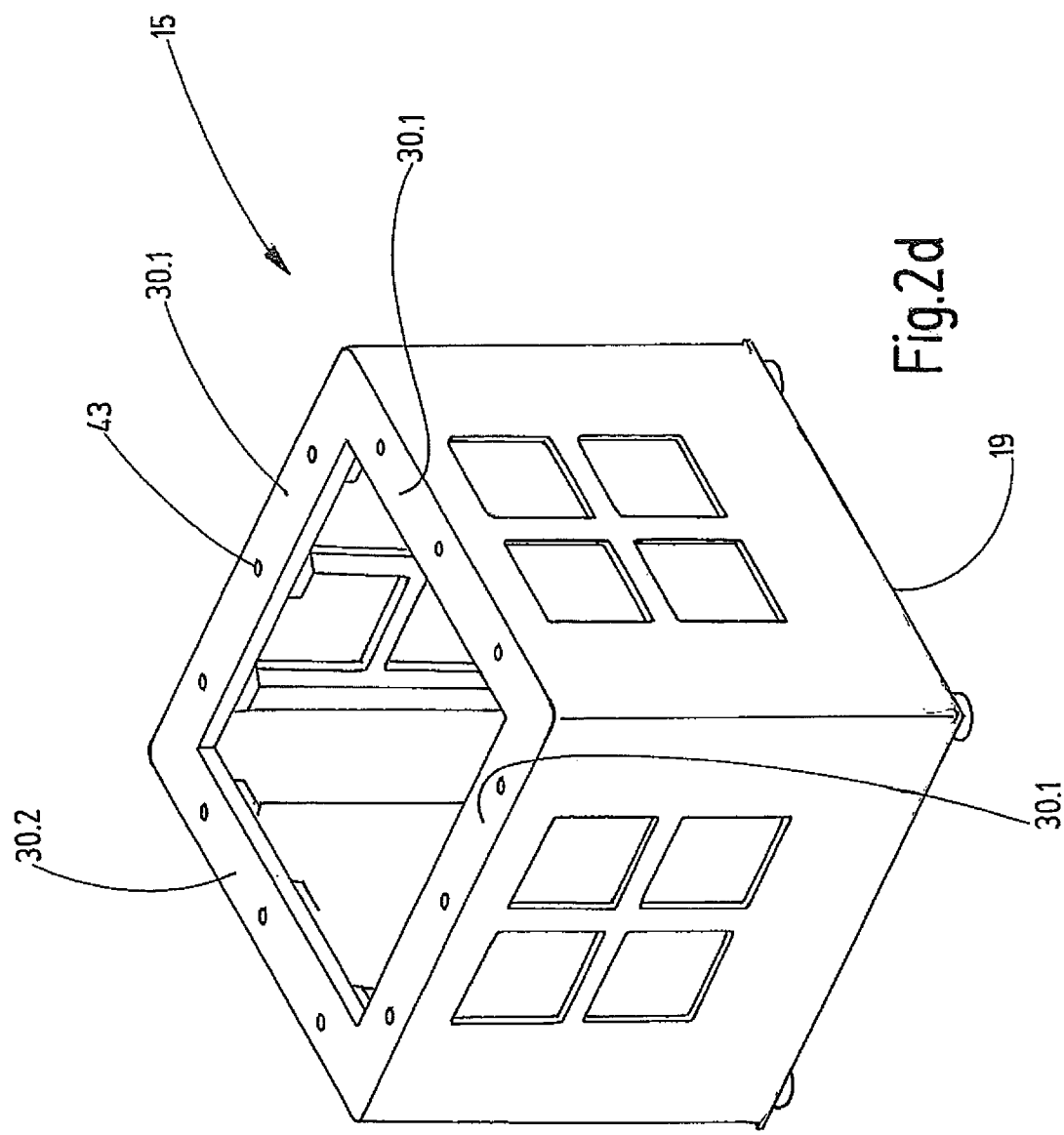

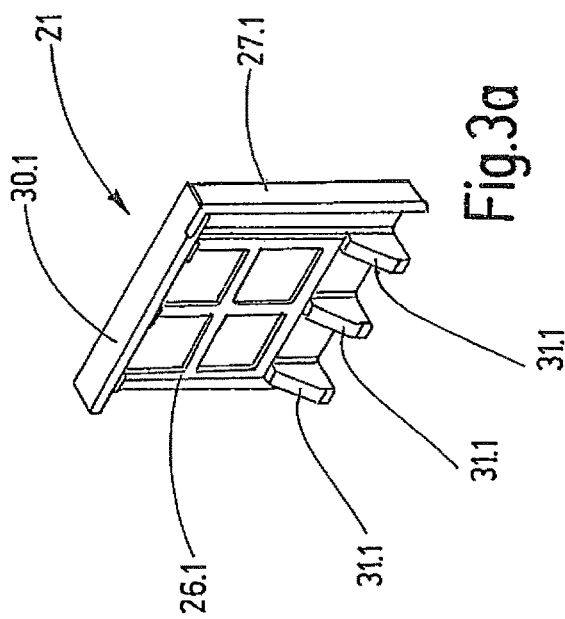
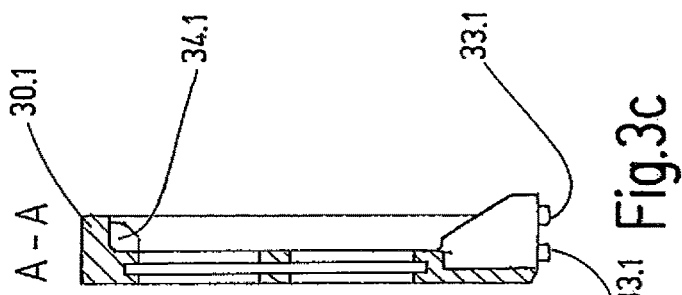
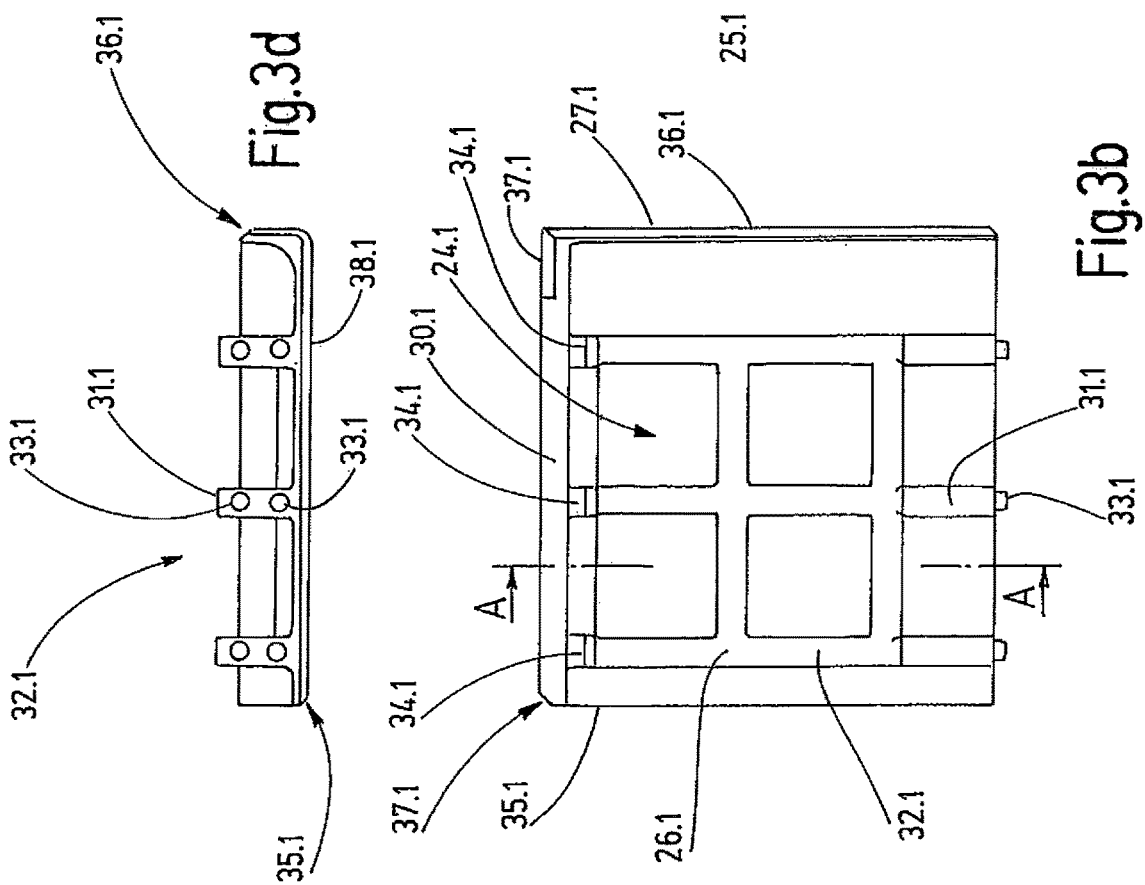

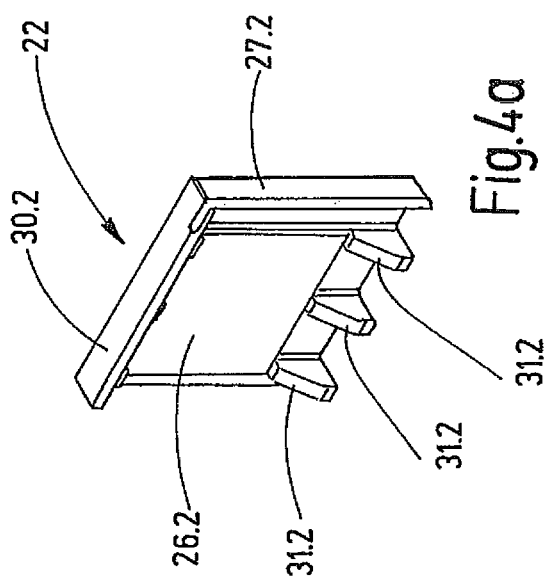
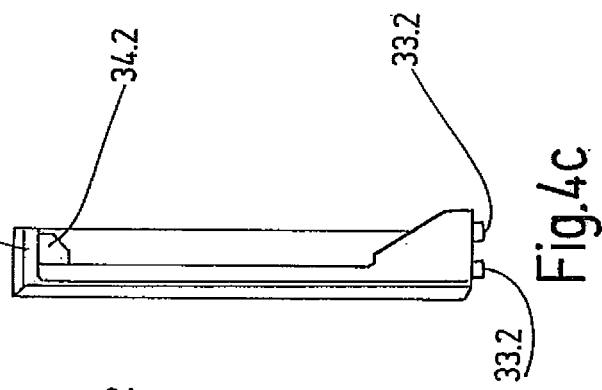
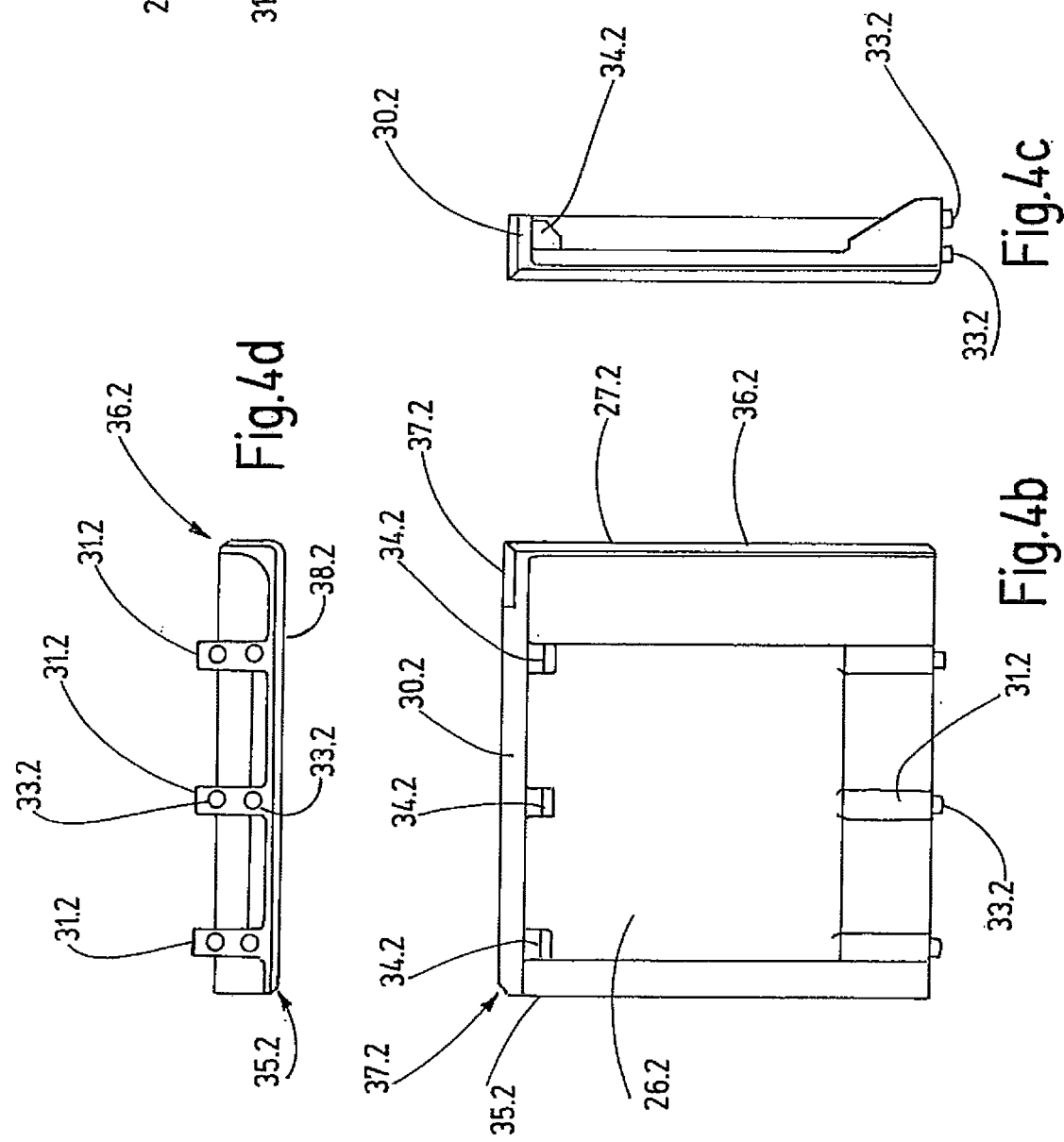

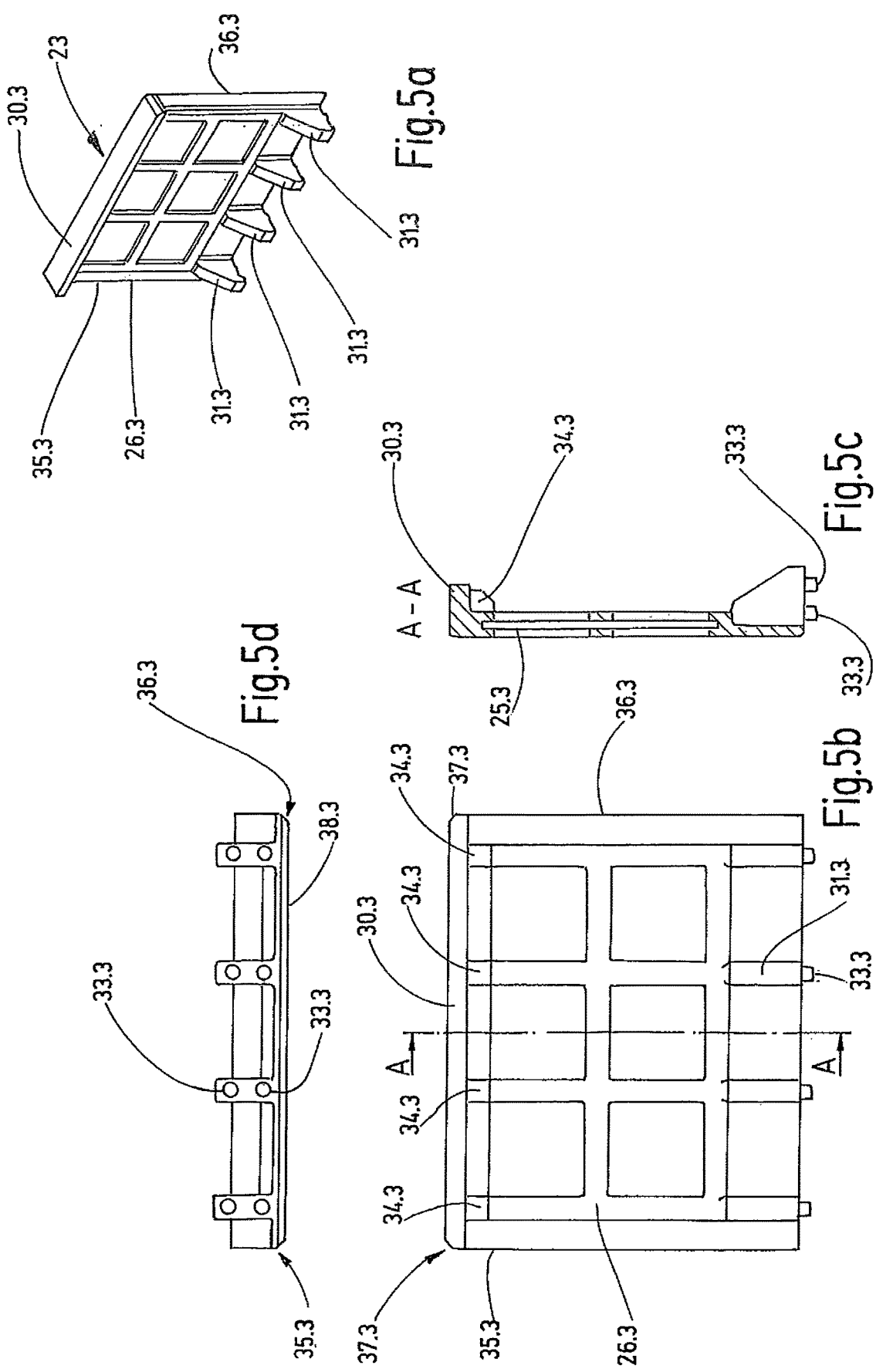

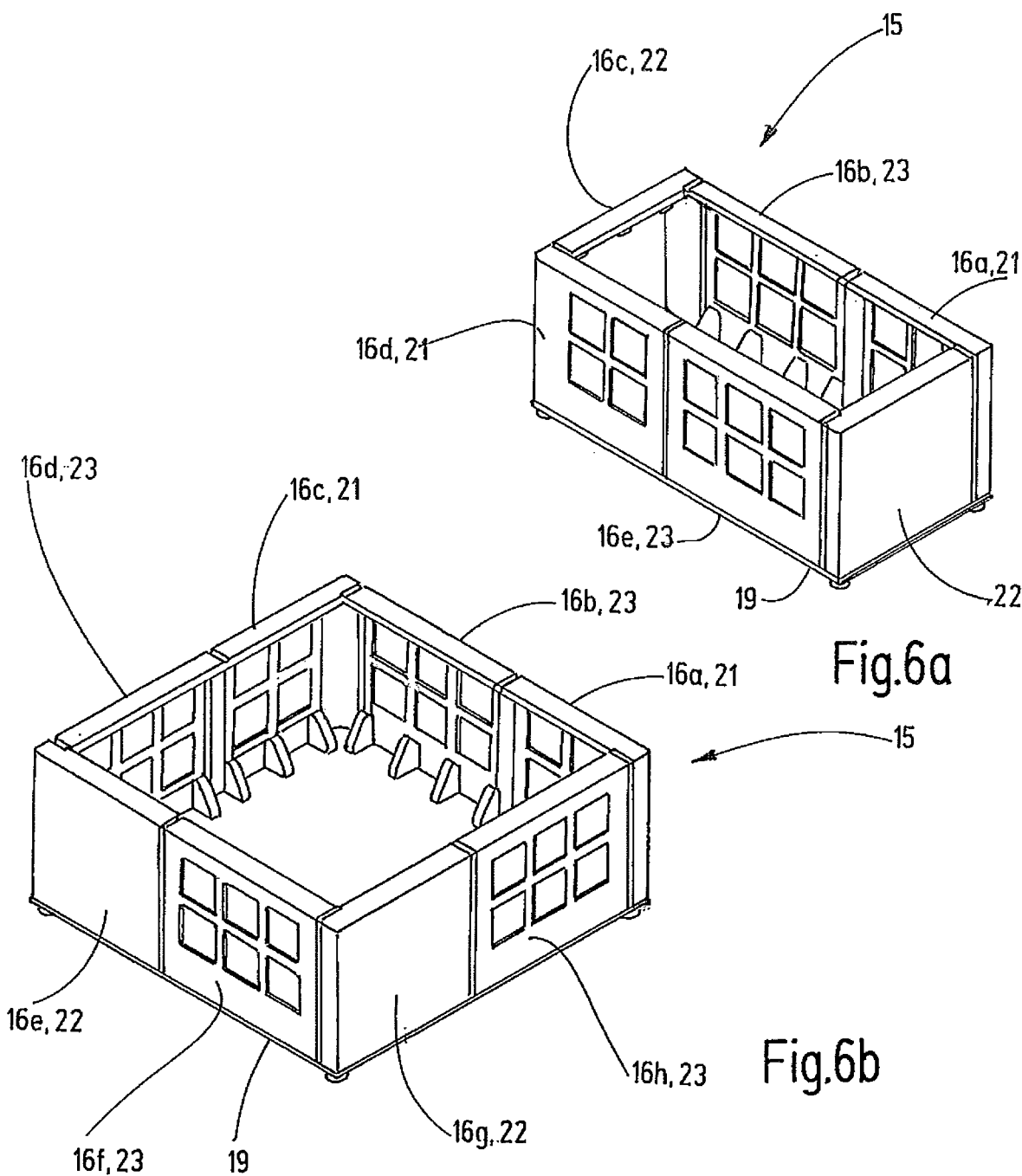

MODULAR SYSTEM FOR PRODUCING A HOUSING

CROSS REFERENCE TO RELATED APPLICATIONS

This application is a National Stage Application of PCT/EP2020/062466, filed on May 5, 2020, which claims the benefit of German Application No. 102019113193.6, filed on May 17, 2019, the contents each of which are incorporated herein by reference thereto.

TECHNICAL FIELD

The invention relates to the field of explosion-proof housings.

BACKGROUND

Explosion-proof housings can in particular be designed according to the 'flameproof enclosure' protection type. This prevents an explosion that is ignited by a working fluid inside the housing from penetrating to the outside and igniting the atmosphere around the housing. For this purpose, an opening of the housing can be closed by a flame arresting filter. Examples of such flame arresting filters can be derived from DE 10 2014 116 149 A1. The flame arresting filter can, for example, be welded to the edge of the opening, or be integrally joined thereto in another manner, as is apparent from DE 10 2017 112 149 A1 and DE 10 2017 122 957 A1. DE 10 2017 112 147 A1 describes a pressure relief body that is cast into a housing wall.

BRIEF SUMMARY

It is an object of the invention to provide a concept by way of which an explosion-proof housing can be produced easily and cost-effectively.

Disclosed is an explosion-proof housing, the housing including at least one wall module of a modular system for producing the housing. Also disclosed is an explosion-proof housing, the housing including at least one wall module of a modular system for producing the housing. Also disclosed is a modular system for producing an explosion-proof housing.

The explosion-proof housing according to the invention is preferably designed according to the 'flameproof enclosure' protection type. The housing can in particular satisfy a corresponding standard, for example the standard IEC/EN 60079-1 (protection type Ex d) or a corresponding US standard.

The housing comprises at least one module of a modular system for producing the housing.

Embodiments of the housing preferably comprise multiple (at least two) wall modules, which can also be referred to as segments. Cast wall modules are preferred. As an alternative or in addition, it is possible to use sheet metal parts, in particular formed sheet metal parts, as wall modules, or wall modules made of formed sheet metal parts. Mixed forms are possible, in which a wall module is made of at least one cast body and at least one sheet metal part. The sheet metal part can, for example, close an opening in the cast body in a flameproof manner.

In addition, a module according to the invention, for example a, preferably cast, wall module, is provided for an explosion-proof housing according to the invention.

According to the invention, a modular system for producing an explosion-proof housing according to the invention comprising at least one kind (type) of module is also provided. Embodiments of the modular system according to the invention can comprise a planar support element, serving as the module. A module can, for example, be a cast wall module or a wall module formed of sheet metal. The modular system can, for example, comprise at least one kind of elongated support elements, which can be arranged to form a frame. Embodiments of the modular system which, as an alternative or in addition, comprise at least one frame-shaped support element, which forms a module of the modular system, are possible. At least one kind of planar or elongated or frame-shaped support element can form an angle. As an alternative or in addition, the modular system can comprise at least one kind of planar or frame-shaped support element, which can be flat.

In addition, a method for producing an explosion-proof housing is provided. The method includes the steps of providing modules, for example wall modules that are cast or formed of sheet metal, and assembling the housing from the modules, for example the wall modules.

Further preferred features and embodiments of the housing, the module, the modular system and/or the method result from the following description:

A wall module can form a side wall, a cover or a bottom. Preferably, one wall module forms, or the wall modules form, side walls.

The wall modules can in particular enclose an interior space of the housing in the circumferential direction or laterally. The housing circumference is preferably closed by means of at least two or at least three or at least four wall modules. The wall modules that close the circumference preferably include at least two or at least three identical (of the same kind) wall modules. The wall modules enclosing the circumference of the interior space preferably belong to no more than three kinds. The kinds are preferably distinguished based on the different designs thereof, the design being cast in embodiments.

At least one wall module of the housing and/or at least one kind of wall module preferably includes a pressure relief opening. This opening can be closed in a flameproof manner by a pressure relief element. Publications cited above provide examples of possible flameproof pressure relief elements (also referred to as flame arresting filters) and the attachment thereof. The pressure relief element can be cast into the wall module, for example. Flameproof means that the closure does not allow any gas or particles to pass that is or are so hot that an explosive atmosphere outside the housing could become ignited. Rather, gaps present in the connecting site are so long, and additionally so narrow, that the gas and particles cool so much, while passing through the gaps, that the gas and the particles would not be able to ignite the atmosphere. The pressure relief element preferably allows gas exchange through the pressure relief opening, for example to ensure pressure equalization between the interior space of the housing and the outside surrounding area in the event of an explosion. The pressure relief element has open pores for this purpose, which preferably form flameproof gaps. At least one other wall module can be free of a pressure relief opening.

Preferably, at least one side of the housing is closed by a plate-shaped element. The element can, for example, form a bottom or a cover of the housing to close the bottom side or the upper side of the housing.

At least one wall module preferably comprises an alignment structure, which cooperates with a mating alignment structure of an element, in particular of a plate-shaped element, used to close the housing so as to arrange the wall module in the correct position relative to the element. At least one wall module preferably comprises at least one protrusion, for example a pin, and/or a recess, which is used to arrange the wall module in the correct position with respect to the element, in particular the plate-shaped element, and/or to connect the plate-shaped element to the wall module. In the assembled housing, the protrusion is preferably arranged in a recess in the element and/or a protrusion of the element is arranged in a recess of the wall module, the first being preferred when the wall module is cast.

At least one wall module preferably comprises a stabilization extension. The stabilization extension can be a rib or a web or an arm, for example. The stabilization extension extends away from the wall module. The stabilization extension can be used to stabilize the wall module and/or the connection between the wall module and the element. The at least one protrusion can be formed, in particular integrally formed, at the stabilization extension. The stabilization extension, and preferably also the protrusion, are preferably integrally formed at the wall module, in particular seamlessly connected in one piece to the wall module. When the stabilization extension, and possibly also the protrusion, are formed as part of the casting process of the wall module, subsequent attachment of the stabilization extension or of the protrusion is dispensed with.

The element can be connected, for example integrally, in particular welded and/or bonded, to the wall module. For example, the at least one protrusion is integrally connected, in particular welded and/or bonded, to the edge of the recess. The element can in particular be connected to the wall module by plug welding through recesses for the protrusions.

The wall modules are preferably integrally connected among one another. The wall modules can in particular be welded and/or bonded among one another.

When the housing is encapsulated according to the 'flameproof enclosure' protection type, existing gaps, which in general lead from the interior space of the housing to the outside, are flameproof. Preferably, a flameproof gap, in particular a flat gap, is defined in the arrangement between the wall modules and the element. The wall modules preferably form a flameproof gap, in particular a flat gap, with the element, in particular the plate-shaped element.

Each of the wall modules preferably comprises a flange section for attaching a further element, in particular the further plate-shaped element. The further element can, for example, form the cover or the bottom. The flange section is preferably seamlessly connected in one piece to the wall module. The flange section is preferably created as part of the casting process for producing the wall module.

The flange sections are preferably integrally connected, in particular welded and/or bonded, among one another.

After the wall modules have been connected among one another, the arrangement of the flange sections can be face-milled to form a flat gap between the flange sections and the element.

The further element can be attached to the flange sections, for example by means of a screw, clamping, weld and/or bonded joint or another form-locked, force-fit and/or integral connection.

While the housing, in principle, can have any arbitrary shape, which results from the arrangement of the wall module, the housing is preferably a polyhedron, in particular a prism, for example a cuboid having edges not of equal lengths or a cube.

Embodiments in which lateral edges of the housing form part of wall modules. Preferably, at least one of the wall modules includes at least one or only one edge of the housing, at least in sections.

Preferably, at least two wall modules are not attached to one another by way of a, or at a, lateral edge, that is, jointly forming an edge, if necessary together with the weld and/or bonded seam. Rather, the weld seam and/or bonded seam are preferably formed next to the edge in the circumferential direction, in particular parallel to the edge, at a distance from the edge of the housing. The weld and/or bonded seam is preferably a sealing seam to be able to dispense with ensuring a flameproof gap in the connection of the wall modules. The connection between the wall modules is completely closed by way of the sealing seam.

A wall module can comprise two wall sections that are angled with respect to one another, wherein the length of a wall section is preferably genuinely larger than the length of the second wall section. The wall sections abut in an imaginary manner at an edge of the housing. This edge (lateral edge) is consequently formed by a single wall module. The wall sections are preferably seamlessly connected in one piece to one another, and are particularly preferably produced during the casting production process of the wall module.

Two wall modules can in particular be welded and/or bonded to one another by way of a butt joint or a butt seam. The wall modules can be oriented transversely, in particular perpendicularly, with respect to one another.

The modular system can, for example, comprise at least one, at least two, or only two, or at least three, or only three different kinds of side wall modules to enclose the interior space in the housing circumferential direction. For example, the kinds of wall modules can be distinguished according to size, shape and/or equipment. In particular, the kinds of wall modules can, for example, be distinguished according to the cast size or the cast shape. Some kinds of wall modules, for example one kind of wall module or two kinds of wall modules, can be equipped with pressure relief openings, while another kind of wall module, for example, does not include a pressure relief opening, that is, is free of pressure relief openings.

In the modular system according to the invention, exactly one kind or exactly two kinds of wall modules can in each case comprise at least one or exactly one vertical lateral edge of the housing and/or one or exactly one kind of wall module which is free of a vertical lateral edge of the housing.

In embodiments, a module can comprise a frame-shaped base body, which surrounds at least one opening that is closed in a flameproof manner by means of at least one sheet metal part.

BRIEF DESCRIPTION OF THE DRAWINGS

Further advantageous features of the invention will be apparent from the dependent claims, the following description and the drawings. In the drawings:

FIG. 1 shows an exemplary embodiment of a housing according to the invention;

FIG. 2a shows a perspective view of an arrangement of four wall modules and a bottom element for the housing according to FIG. 1 by way of example;

FIG. 2b shows an exploded view of the arrangement according to FIG. 2a;

FIG. 2c shows a perspective view of the housing arrangement according to FIGS. 2a and 2b from beneath;

FIG. 2d shows a perspective view of the arrangement according to FIGS. 2a and 2c after further manufacturing steps;

FIG. 3a shows a first kind of wall module of an exemplary embodiment of a modular system in a perspective view;

FIG. 3b shows the wall module of the first kind according to FIG. 3a in a view of the inner side of the wall module;

FIG. 3c shows a sectional view through the wall module according to FIG. 3b;

FIG. 3d shows a view onto the bottom side of the wall module according to FIG. 3a;

FIG. 4a shows a second kind of wall module of the modular system in a perspective view;

FIG. 4b shows the wall module of the second kind according to FIG. 4a in a view of the inner side of the wall module;

FIG. 4c shows another view of the wall module of the second kind according to FIGS. 4a to 4b;

FIG. 4d shows a view onto the bottom side of the wall module according to FIG. 4a;

FIG. 5a shows a third kind of wall module of a modular system in a perspective view;

FIG. 5b shows the wall module of the second kind according to FIG. 5a in a view of the inner side of the wall module;

FIG. 5c shows a sectional view through the wall module according to FIG. 5b;

FIG. 5d shows a view onto the bottom side of the wall module according to FIG. 5a;

FIG. 6a, by way of example, shows another arrangement of wall modules of the modular system to form a housing according to the invention;

FIG. 6b, by way of example, shows yet another arrangement of wall modules of the modular system for a housing according to the invention;

DETAILED DESCRIPTION

Figure 7A:
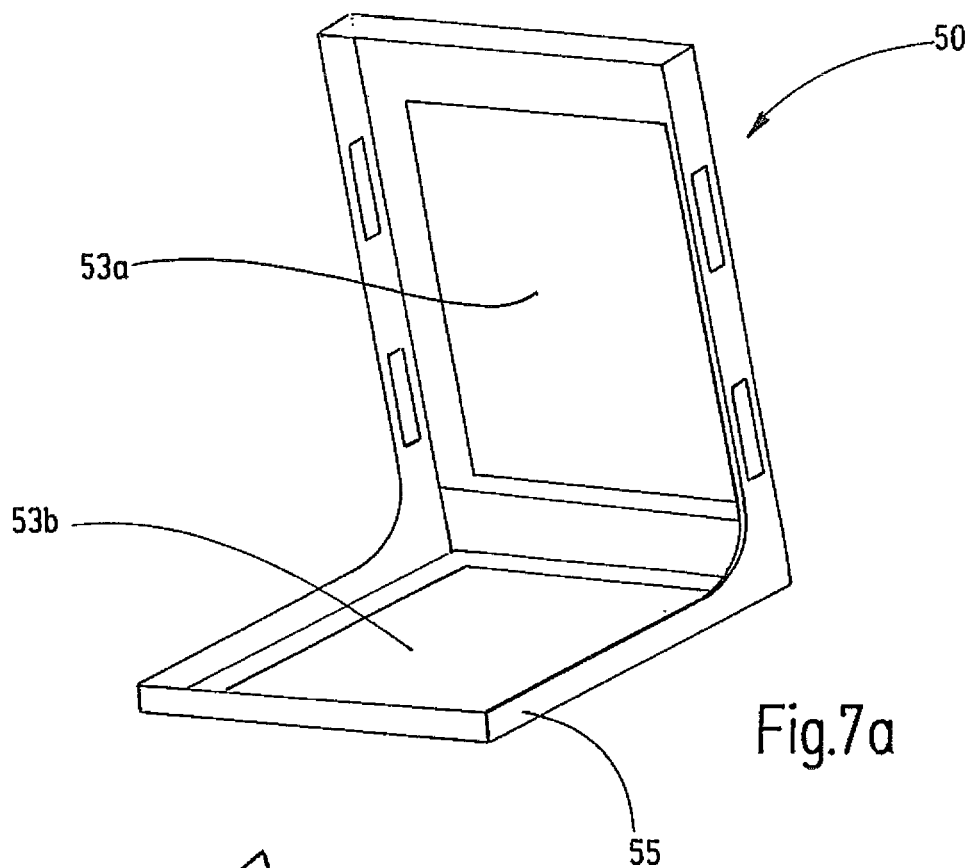
FIG. 7a shows a base body of another exemplary embodiment of a modular system according to the invention.

FIG. 1 shows an exemplary embodiment of a housing 10 according to the invention. The housing 10 comprises four vertical circumferential sides 11a to 11d. The housing 10 comprises a bottom 12 and a cover 13. The illustrated exemplary embodiment of the housing 10 is cuboid having differently long edges or is cube-shaped. The housing 10 comprises four parallel vertical lateral edges 14a to 14d.

FIGS. 2a to 2d show an exemplary embodiment of an arrangement 15 of four wall modules 16a to 16d according to the invention of which the housing 10 according to FIG. 1 is composed.

The arrangement 15 according to FIGS. 2a to 2d is assembled from four cast wall modules 16a to 16d, which enclose the interior space 17 of the housing 10 in the circumferential direction or laterally. The circumferential direction is defined in a horizontal plane. The cast wall modules 16a to 16d form the vertical circumferential side walls of the housing 10. In principle, the wall modules 16a to 16d or individual wall modules can also be produced, in particular pressed, from sheet metal. The bottom 12 is formed by a plate-shaped element 19. The cover 13 (not shown in FIGS. 2a to 2d) is likewise formed by a plate-shaped element 20.

The housing 10 is assembled from two different kinds 21, 22 of wall modules of a modular system. A first kind 21 of wall module of the modular system is characterized by comprising pressure relief openings 24.1 (for example, as shown, four pressure relief openings 24.1 or in the case of the third kind 23 of wall modules according to FIGS. 5a to 5d, for example, six pressure relief openings 24.3) and by the dimension of the wall modules of the kind 21. This kind 21 of wall modules is shown separately in FIGS. 3a to 3d. Each of the pressure relief openings 24.1 is closed in a flameproof manner by one or more gas-permeable pressure relief elements 25.1.

Three identical wall modules 16a to 16c, that is, three specimens of the first kind 21 of wall module of the modular systems, are arranged so as to abut one another.

A second kind 22 of wall module (shown separately in FIGS. 4a to 4c) of the modular system does not include a pressure relief opening, but is otherwise identical to the first kind 21 of wall module, at least with respect to the outer shape and/or the dimensions.

A specimen of the second kind 22 of wall module belongs to the arrangement 15 according to FIGS. 2a to 2d. Embodiments of the arrangement 15 or of the housing 10 which comprise exactly two or exactly four specimens of the first kind 21 or of the second kind 22 of wall module are possible.

The first kind 21 of wall module according to FIGS. 3a to 3d comprises a planar first wall section 26.1. The wall module comprises a second wall section 27.1, which is angled with respect to the first wall section 26.1, for example angled perpendicularly. The first wall section 26.1 and the second wall section 27.1 abut, in an imaginary manner, an edge that is formed by a vertical lateral edge 14a, 14b, 14c, 14d of the housing 10. On the opposite side, the wall modules of the first kind 21 do not comprise a lateral edge 14a, 14b, 14c, 14d of the housing. Rather, this edge forms part of a further specimen of a wall module of the same kind 21 or of the second kind 22, which belongs to the arrangement 15. The first wall section 26.1 and the second wall section 27.1 are seamlessly connected in one piece to one another. The casting mold (tool) is preferably designed accordingly to generate the wall modules of the first kind 21 with the first wall section 26.1 and the second wall section 27.1.

The wall module 21 of the first kind of wall module comprises a flange section 30.1. The flange section 30.1 is arranged so as to be angled transversely, for example perpendicularly, to the first wall section 26.1 and the second wall section 27.1. The flange section 30.1 and the first wall section 26.1 and the second wall section 27.1 are seamlessly connected in one piece to one another. The casting mold is accordingly designed to generate the first wall section 26.1, the second wall section 27.1 and the flange section 30.1 in a way in which these are integrally formed with one another.

Stabilization extensions 31.1 are integrally formed at the first wall section 26.1. The stabilization extensions 31.1 are seamlessly connected in one piece to the first wall section 26.1 during the production of the wall module 21.1 by casting. These stabilization extensions 31.1 in the form of ribs extend away from the first wall section 26.1, and more particularly away from the inner side 32.1 of the first wall section 26.1, that is, in the arrangement 15 into the interior space 17 of the housing 10. Protrusions 33.1 are arranged at each stabilization extension 31.1. The protrusions 33.1 are preferably integrally formed at the stabilization extension 31.1, particularly preferably formed during casting of the wall module 21. The protrusions 33.1 can also be connected to the stabilization extensions 31.1 in another manner, for example by a weld joint or a bonded joint. However, integrally forming the protrusions 33.1 during casting is clearly preferred since these are used to arrange the wall modules 16a to 16d in the correct position relative to one another, relative to the bottom element 16 and the connection of the bottom element 16 to the wall modules 16a to 16d.

The flange section 30.1 is connected, on the one hand, directly to the first wall section 26.1 and, on the other hand, via further rib-like stabilization extensions 34.1 to the first wall section 26.1. The further stabilization extensions 34.1 are seamlessly connected in one piece to the first wall section 26.1 and to the flange section 30.1.

Edge sections 35.1, 36.1, 37.1 at the first wall section 26.1, at the second wall section 27.1 and at the flange section 30.1 are designed to be integrally joined, in particular welded, to corresponding edge sections of an abutting wall module. The edge sections 35.1, 36.1, 37.1 can, for example, comprise a chamfer, as shown. The edge section 38.1 of the wall element 21 can be used for integral joining, in particular joining by welding, to the bottom plate 19.

As is apparent from FIG. 3c, the pressure relief element 25.1 is preferably cast into the wall module 21 to close the pressure relief openings 24.1. Integral casting eliminates a subsequent connection of the pressure relief element 25.1 to the wall module 21. The pressure relief element 25.1 can, for example, be a mesh or a mesh arrangement, for example a woven mesh or a laid mesh or, for example, a random fiber body.

The second kind of wall modules 22 that are identical among one another according to FIGS. 4a to 4c differs from the first kind of wall modules 21 that are identical among one another according to FIGS. 3a to 3c in that no pressure relief openings are present. Otherwise, the shape, in particular the dimensions, of the cast further wall modules according to the second kind is identical. As a result, the description of the first kind 21 of wall module can thus otherwise be used to describe the second kind of wall module 22, in particular the first wall section 26.2, second wall section 27.2, flange section 30.2, stabilization extensions 31.2, further stabilization extensions 34.2, protrusions 33.2 thereof that are seamlessly connected in one piece to one another.

The third kind of wall modules 23 that are identical among one another, which is shown in FIGS. 5a to 5s, is preferably not to be connected to a further wall module 23 of the third kind across the corners. Rather, lateral edges 14a to 14d of the housing 10 are preferably exclusively intended to be formed by a wall module 21 of the first kind or a wall module 22 of the second kind of wall module. The wall modules of the first kind 21 and of the second kind 22 form these wall sections 26.1 and 27.1 or 26.2 and 27.2 that are angled with respect to one another, which abut in an imaginary manner at a lateral edge of the housing, so that the relevant lateral edge is formed by a single wall module 21 or 22. In this way, wall modules do not have to be welded and/or bonded across the corners, but can be connected to one another by way of a butt joint.

The third kind of wall module 23 differs from the first kind of wall module 21 in the dimension and the absence of a second wall section. The description of the first kind 21 of wall modules can otherwise be used to describe the third kind 23 of wall module. In particular, the third kind 23 can include pressure relief openings 24.3, as is apparent by way of example from FIGS. 5a to 5c. The first wall section 26.3, the stabilization extensions 31.3, the further stabilization extensions 34.3 as well as the flange section 30.3 are preferably, for example as illustrated, seamlessly integrally formed in one piece. The protrusions 33.3 can likewise be integrally formed at the stabilization extension 31.3 during casting of the wall module 23. As an alternative, the protrusions 31.3 can have been subsequently attached to the stabilization extensions 31.3.

Using the exemplary embodiment of the modular system according to the invention comprising only three different wall modules 21, 22, 23, it is possible to produce housings 10 of different sizes, as is apparent from FIGS. 1a, 6a and 6b, which show the arrangements 15 of wall modules. Exemplary embodiments of the modular system according to the invention comprising only two different kinds, for example the first kind 21 and second kind 22 or the first kind 21 and third kind 23 or the second kind 22 and third kind 23, are possible.

The procedure during the production of an explosion-proof housing 10, for example of the housing 10 according to FIG. 1, can be carried out as follows, for example:

Preferably cast wall modules 16a to 16d are provided. If a housing 10 according to FIG. 1a is to be produced, two different kinds 21, 22 of wall modules are needed, and more particular three wall modules 21 of the first kind, which each include pressure relief openings 24.1, and one wall module 22 of the second kind, which has the same size, but does not include any pressure relief openings. Explosion-proof, in particular flameproof, cable feedthroughs can be introduced into one or more wall modules, in particular those without pressure relief opening, to electrically contact components in the interior space 17 of the housing 10, which can form ignition sources. To enclose an interior space 17 of the housing 10 in the circumferential direction by way of the preferably cast wall elements 16a to 16d, the wall modules 16a to 16d are arranged to form a cuboid configuration of side walls, and more particular so that the pins 33.1, 33.2 are guided through recesses 40 in the plate 19, which can form the bottom 12 of the housing 10, as is apparent from FIG. 2c. In this way, the wall modules 16a to 16d can be easily correctly positioned relative to the plate 19 and to one another. As an alternative or in addition to pins formed at the wall modules 16a to 16d, corresponding pins can be formed at the plate 19, which can form the bottom or a rear wall, the pins engaging in recesses in the wall modules 16a to 16d. The wall modules 16a to 16d can also easily be correctly positioned relative to the plate 19 using such an alignment device.

The plate 19 is connected to the wall modules 16a to 16d by way of plug weld spots through the recesses 40 in the plate 19. In the process, a weld joint is created, in particular between the plate 19 and the pins 33.1, 33.1. It may be necessary to close a gap between the wall modules 16a to 16d and the plate 19 by way of a circumferential weld and/or bonded seam, that is, to form a sealing seam.

The wall modules 16a to 16d are connected among one another at the butt joint sites by butt seams, in particular weld and/or bonded seams. These are preferably sealing seams, so as not to have to ensure a flameproof gap between the abutting wall modules 16a to 16d. The edge sections 35.1, 35.2, 36.1, 36.2, 37.1, 37.2, which are provided with chamfers, of the first wall sections 26.1, 26.2, the second wall sections 27.1, 27.2 and the flange sections 30.1, 30.2 of the wall modules 16a to 16d are used for this purpose. As a result of the chamfers, the edge sections 35.1, 35.2, 36.1,

36.2, 37.1, 37.2 form V-shaped recesses between abutting wall modules so as to form the butt joints for connecting the wall modules 16a to 16d.

As in the illustrated exemplary embodiments, at least two wall modules 16a to 16d are preferably not attached to one another by way of a or at a lateral edge 14a to 14d of the housing 10, that is, jointly, if necessary by way of the weld and/or bonded seam, forming a lateral edge 14a to 14d. Rather, the weld seam and/or bonded seam are preferably formed next to the lateral edge 14a to 14d, in particular parallel to the lateral edge 14a to 14d, at a distance from the lateral edge 14a to 14d.

Feet 41 can be attached to the bottom plate 19 at the corners, for example by welding (FIG. 1c). An arrangement as shown in FIG. 2d is obtained. The weld seams are not shown separately in FIG. 2d. In FIG. 1, weld seams between wall modules and between the wall modules and the bottom plate 19 are assigned reference numeral 42.

To be able to reliably close the housing 10, the flange formed by the at least four connected flange sections 30.1, 30.2 in the illustrated exemplary embodiments is preferably face-milled. Threaded boreholes 43 can be introduced into the flange, or other connecting means can be provided, to connect the cover plate 20 to the flange so as to close the housing 10. A flameproof flat gap is preferably formed between the flange surface and the cover plate 20.

The threaded boreholes 43 are preferably blind holes, which can extend into the further stabilization extensions 34.1, 34.2, however without penetrating into the interior space 17 of the housing 10. In this way, on the one hand, high stability of the connection of the element 20 for forming the housing cover 13 is achieved, so as to allow the housing 10 to be reliably closed and, on the other hand, an explosion-proof threaded gap is prevented from having to be formed at this location.

Housings 10 having different sizes can be produced from cast and/or formed parts by way of the modular system according to the invention, without having to provide a dedicated casting mold or forming tool for each size of the housing 10. In addition, it is less expensive to transport the individual wall modules 16a to 16h to the manufacturer of the housing 10, than when a cast housing body has to be transported, which forms four circumferential sides 11a to 11d, for example. It is particularly easy to arrange and fix the wall modules 16a to 16h in a correct position at a plate 19, for example a bottom plate 19, when pins or other protrusions 33.1, 33.2, 33.3 and corresponding recesses 40 are present in the plate 19 for fixing the wall modules 16a to 16h. A housing 10 can be produced particularly cost-effectively by way of the modular system according to the invention when plate material (in particular commercially available standardized semi-finished product) is used for the housing bottom 12 and the housing cover 13. The individual wall modules 16a to 16h are preferably integrally joined among one another and to one or both plate-shaped elements 19, 20, in particular by welding, bonding, or both combined. The wall modules 16a to 16h are preferably made of metal, in particular aluminum or steel, or plastic. As an alternative to cast wall modules 16a to 16h, it is possible to use formed sheet metal parts as wall modules 16a to 16h or wall modules made of formed sheet metal parts.

Figure 7B:
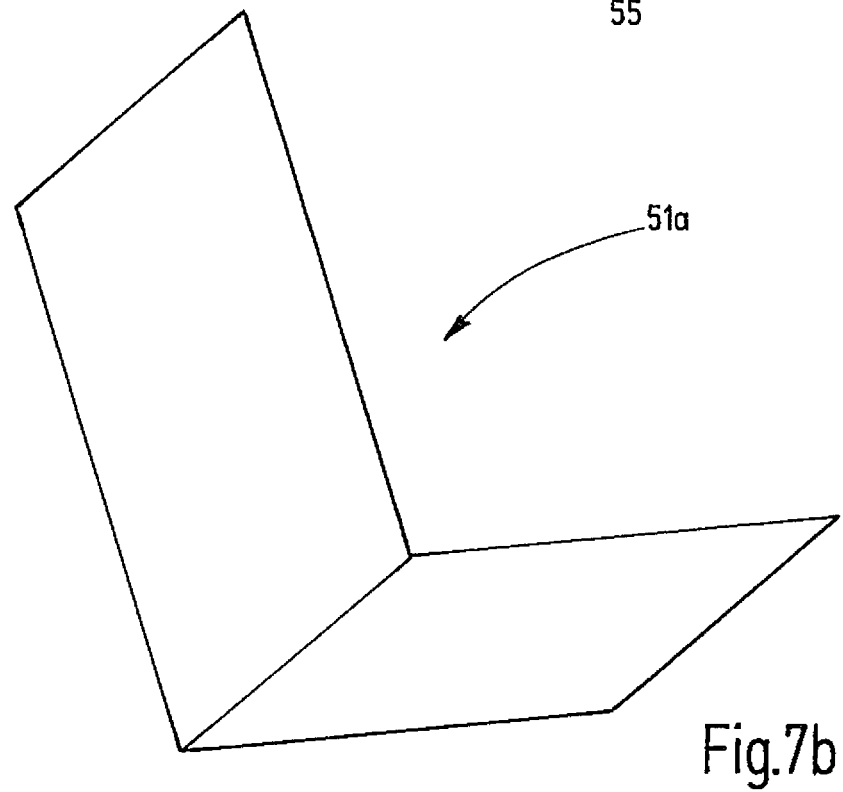
FIG. 7b shows a closing element for closing openings in the base body.
Figure 7C:
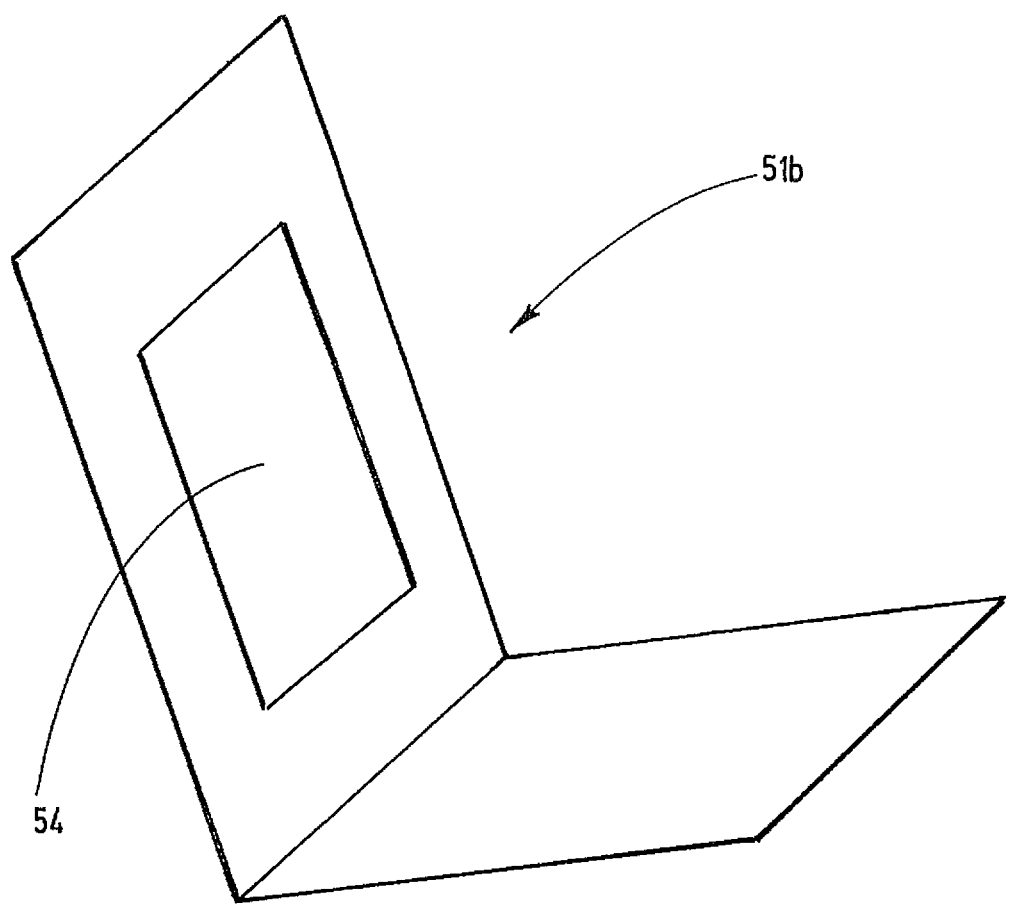
FIG. 7c shows another exemplary embodiment of a closing element for closing openings in the base body.
Figure 8:
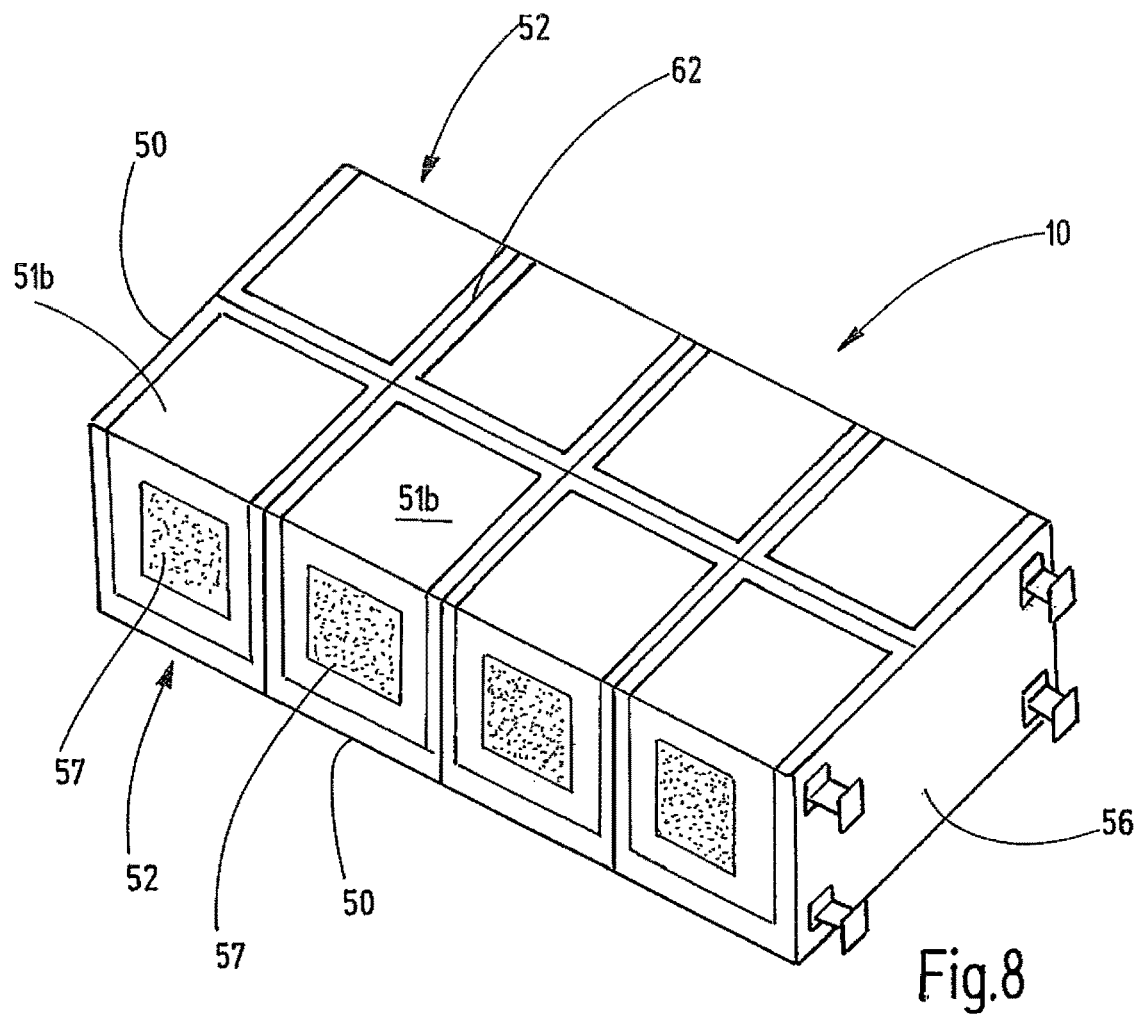
FIG. 8 shows an example of a housing made of wall modules.

FIG. 7a shows an exemplary embodiment of a base body 50 as a module of a modular system according to the invention. Together with a closing element 51a, 51b, the module 50 can form a wall module 52. FIG. 7b shows an example of such a closing element 51a of the wall module 52. FIG. 7c shows a further example of a closing element 51b. FIG. 8 shows a perspective view of the rear of a housing 10 composed of wall modules 52 of the type assembled from the base body 50 and closing elements 51a, 51b according to FIGS. 7a, 7b, 7c. The wall module 52 is an example of a wall module that is produced from at least one cast base body 50 and at least one sheet metal part 51a, 51b. Such a base body 50 can include at least one opening 53a, 53b to save weight, which can be closed in a flameproof manner by way of the one closing element 50a, 50b.

The base body 50 has an angled or L-shaped configuration. As an alternative, the base body 50 can be planar and, if necessary, comprise a connecting shoulder. For example, the edge sections 35.1, 36.1, 37.1 of the embodiment according to FIGS. 1 to 6b form a connecting shoulder at a planar wall module. It is also possible to provide a U-shaped base body.

The types of closing element 50a, 50b for closing the openings 53a, 53b can have a shape that corresponds to the shape of the base body 50, for example an L shape. As an alternative, multiple openings 53a, 53b can each be closeable by a planar closing element 50a, 50b. The closing elements 51a, 51b can be attachable to the outside of the base body or arrangeable in the base body. Further embodiments make both possible. The closing element 50a according to FIG. 7b does not include any openings in the region for closing the openings in the base body. The closing element 50b according to FIG. 7c includes a pressure relief opening 54, which is to be closed by a flameproof pressure relief body 54 in the case of a housing 10 in the form of a flameproof enclosure.

The base body 50 preferably comprises an alignment structure 55, for example a borehole 55, by way of which the base body 50 can be aligned relative to an adjoining base body 50 and/or prefixed thereon, for example by way of a screw joint, so as to align the arrangement of the modules 50, and subsequently fix the alignment, for example by way of weld and/or bonded joints. As is illustrated in FIG. 8, the wall modules 52 are arranged next to one another in pairs in an extension direction, here the height direction. Each pair encloses a section of the housing interior space in a U-shaped manner in the extension direction. By varying the number of pairs that are arranged next to one another, it is possible to produce housings 10 having different heights, and thus housings 10 having different inside volumes.

The modules 50 of a pair can, for example, be welded and/or bonded to one another at the abutting surfaces. The modules 50 abutting one another in a row direction can, for example, be welded and/or bonded to one another at the abutting surfaces. The weld and/or bonded seams form sealing seams so that no flameproof gap, for example a flat gap, has to be ensured at the abutting surfaces. The plate-shaped elements 56, which form the bottom and the upper side of the housing 10, are also preferably connected to the abutting modules 50 by sealing seams. The front side of the housing 10, on which the housing 10 rests in FIG. 8, can be closed by a closing element, wherein a flameproof gap is formed between the closing element and the housing 10. As is apparent from FIG. 8, all base bodies 50 of the front row in the view are closed by closing elements 50b of the type according to FIG. 7c, wherein the pressure relief opening in the closing element 51b is closed by a flameproof, gas-permeable pressure relief element 57. The pressure relief element 57 is preferably arranged on the interior space side of the closing element 51b so as to be pushed from the inside against the closing element 51b in the event of an explosion. As an alternative, it is possible to directly close an opening in the base body 50 by a pressure relief body 57, without interposing a closing element. Other base bodies 50 of the housing can be closed by way of closing elements 50a of the type according to FIG. 7b when a pressure relief element is not required at the corresponding site of the base body 50. The pressure relief elements 57, or also 25.1, 25.3 (see FIG. 1), can be protected against soiling, in particular the clogging of pores, by dust and/or moisture by way of a protective element (not shown), the protective element being destroyed and/or ruptured during an explosion so as to expose the fluidic connection between the interior space 17 of the housing 10 and the surrounding area through the pressure relief elements 57 or 25.1, 25.3.

Figure 9:
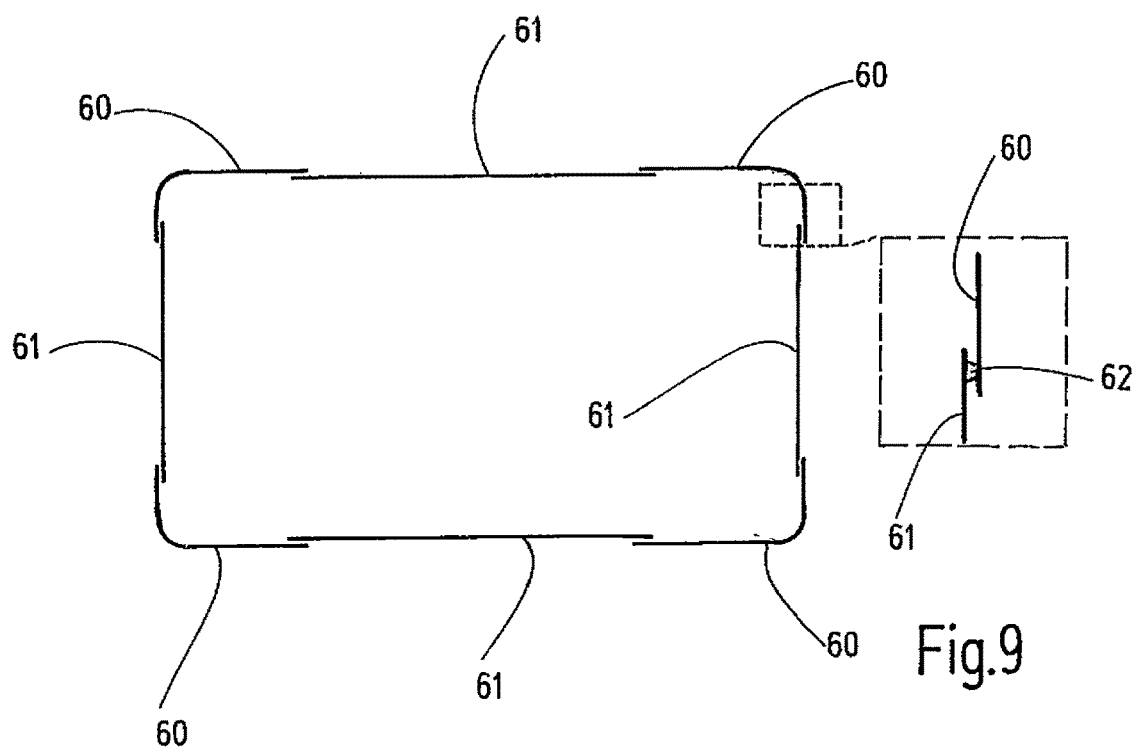
FIG. 9 shows another exemplary embodiment of a housing assembled from wall modules.

FIG. 9 illustrates a housing 10 according to the invention, the circumference of which is assembled from corner modules 60 and surface modules 61 made of sheet metal, which are welded and/or bonded to one another, forming sealing seams 62. The sealing seams 62 are in each case configured parallel to the adjoining round edge 63 of the housing 10. A corner joint, which forms the edge, is thereby avoided so as to achieve particularly high explosion resistance. The sealing seams 62 connect adjoining modules 60, 61 by way of a lap joint (see section in FIG. 9). As an alternative, adjoining modules 60, 61 can be connected to one another at the butt joint.

While the figures show cuboid housings 10, embodiments of the modular system according to the invention can also be suitable for producing housing shapes that differ from the cuboid shape. In such embodiments, the outer sides of mutually abutting wall modules can, for example, include an angle of 90°, for example to be able to produce an L-shaped or U-shaped housing.

The concept according to the invention is in particular suitable for modules made of steel, aluminum or plastic.

An explosion-proof housing (10), preferably of the 'flameproof enclosure' protection type, is provided, wherein the housing 10 is assembled from multiple (at least two) wall modules (16a to 16h) of a modular system comprising one or more module types.

| List of reference numerals: | |
|---|---|
| 10 | housing |
| 11a-d | circumferential sides (walls) |
| 12 | bottom |
| 13 | cover |
| 14a-d | lateral edges |
| 15 | arrangement |
| 16a-h | wall module |
| 17 | interior space |
| 19 | element |
| 20 | element |
| 21 | specimen of a first type of wall module |
| 22 | specimen of a second type of wall module |
| 23 | specimen of a third type of wall module |
| 24.1, 24.3 | pressure relief opening |
| 25.1, 25.3 | pressure relief element |
| 26.1, 26.2, 26.3 | first wall section |
| 27.1, 27.2 | second wall section |
| 30.1, 30.2, 30.3 | flange section |
| 31.1, 31.2, 31.3 | stabilization extensions |
| 32.1, 32.2, 32.3 | inner side |
| 33.1, 33.2, 33.3 | protrusion |
| 34.1, 34.2, 34.3 | further stabilization extensions |
| 35.1, 35.2, 35.3 | edge section |
| 36.1, 36.2, 36.3 | edge section |
| 37.1, 37.2, 37.3 | edge section |
| 38.1, 38.2, 38.3 | edge section |
| 40 | recess |
| 41 | foot |
| 42 | weld seam |
| 43 | threaded borehole |
| 50 | base body |
| 51a | closing element |
| 51b | closing element |
| 52 | wall module |
| 53a | opening |
| 53b | opening |
| 54 | pressure relief opening |
| 55 | alignment structure/borehole |
| 56 | plate-shaped element |
| 57 | pressure relief element |
| 60 | corner module |
| 61 | surface module |
| 62 | sealing seam |
| 63 | edge |

The invention claimed is:

1. An explosion-proof housing, the housing comprising a plurality of wall modules of a modular system for producing the housing, wherein each wall module of the plurality of wall modules comprises at least one protrusion for arranging an element in a correct position relative to the wall module, the at least one protrusion engages in a recess of the element, wherein each wall module of the plurality of wall modules forms a flange section for attaching a plate shaped element the arrangement of each flange section of the plurality of wall modules being worked, after the plurality of wall modules have been joined, so as to form a flat gap between each flange section of the plurality of wall modules and the plate shaped element.

2. The housing according to claim 1, wherein the plurality of wall modules are cast wall modules, or the plurality of wall modules are made of sheet metal.

3. The housing according to claim 1, wherein each wall module of the plurality of wall modules includes a pressure relief opening.

4. The housing according to claim 1, wherein a pressure relief element is cast into each wall module of the plurality of wall modules including a pressure relief opening.

5. The housing according to claim 1, wherein at least one side of the housing is closed by a plate-shaped element.

6. The housing according to claim 1, wherein the plurality of wall modules form a flameproof gap with a preferably plate-shaped element.

7. The housing according to claim 1, wherein each wall module of the plurality of wall modules comprises one or more stabilization extensions extending away from the each wall module of the plurality of wall modules.

8. The housing according to claim 1, wherein the at least one protrusion is formed at a stabilization extension.

9. The housing according to claim 1, wherein the at least one protrusion is welded to an edge of the recess.

10. The housing according to claim 1, wherein the plurality of wall modules are integrally joined among one another.

11. The housing according to claim 1, wherein lateral edges of the housing form part of the plurality of wall modules.

12. An explosion-proof housing, the housing comprising the plurality of wall modules of a modular system for producing the housing of claim 1.

13. A modular system for producing an explosion-proof housing for producing a housing according to claim 1.

14. The modular system according to claim 13, wherein each of the plurality of wall modules are cast.

15. The housing according to claim 1, wherein each of the plurality of wall modules includes a pressure relief opening.

16. A method for producing an explosion-proof housing, comprising the following steps:

providing cast wall modules; and assembling the housing from the cast wall modules, wherein each cast wall module comprises at least one protrusion for arranging an element in a correct position relative to the cast wall module, the at least one protrusion engages in a recess of the element, wherein each cast wall module forms a flange section for attaching a plate shaped element the arrangement of each flange section of the cast wall modules being worked, after the cast wall modules have been joined, so as to form a flat gap between each flange section of the cast wall modules and the plate shaped element.

17. The method according to claim 16, the method comprising the following steps: arranging the cast wall modules to form the housing or a substructure of the housing; aligning the housing or the substructure of the housing; and fixing an alignment of the housing or the substructure of the housing.

* * * * *